(12) United States Patent
Morrison et al.

(10) Patent No.: US 11,581,700 B1
(45) Date of Patent: Feb. 14, 2023

(54) MULTIPLE OPTOELECTRONIC DEVICES WITH THERMAL COMPENSATION

(71) Applicant: Freedom Photonics LLC, Goleta, CA (US)

(72) Inventors: Gordon Barbour Morrison, Summerland, CA (US); Donald J. Kebort, Santa Barbara, CA (US)

(73) Assignee: Freedom Photonics LLC, Goleta, CA (US)

( * ) Notice: Subject to any disclaimer, the term of this patent is extended or adjusted under 35 U.S.C. 154(b) by 129 days.

(21) Appl. No.: 17/062,462

(22) Filed: Oct. 2, 2020

Related U.S. Application Data

(60) Provisional application No. 62/910,826, filed on Oct. 4, 2019.

(51) Int. Cl.
*H01S 5/024* (2006.01)
*H01S 5/0225* (2021.01)
*H01S 5/40* (2006.01)
*H01S 5/06* (2006.01)
*H01S 5/068* (2006.01)

(52) U.S. Cl.
CPC .............. *H01S 5/024* (2013.01); *H01S 5/0225* (2021.01); *H01S 5/068* (2013.01); *H01S 5/0612* (2013.01); *H01S 5/40* (2013.01)

(58) Field of Classification Search
CPC .............. H01S 5/02326; H01S 5/02253; H01S 5/02255; H01S 5/06
USPC .................................................. 372/43.01, 20
See application file for complete search history.

(56) References Cited

U.S. PATENT DOCUMENTS

2002/0090011 A1* 7/2002 Pezeshki ............... H01S 5/4031
372/20

* cited by examiner

*Primary Examiner* — Tuan N Nguyen
(74) *Attorney, Agent, or Firm* — Knobbe, Martens, Olson & Bear, LLP

(57) ABSTRACT

An optical apparatus comprising at least two optoelectronic devices fabricated on the same substrate and in thermal communication with each other. A first optoelectronic device is configured to generate optical signals and provide them to an optical system via an optical output port. A second optoelectronic device is configured to provide heat compensation for the first optoelectronic device. An electrical circuitry provides first electrical signals to the first optoelectronic device and second electrical signals to the second optoelectronic device. The electrical circuitry is configured to adjust at least the second electrical signals to controllably adjust a temperature of the first optoelectronic device.

22 Claims, 8 Drawing Sheets

MULTIPLE OPTOELECTRONIC DEVICES WITH THERMAL COMPENSATION

INCORPORATION BY REFERENCE TO ANY PRIORITY APPLICATIONS

This application claims the benefit under 35 U.S.C. § 119(e) of U.S. Provisional Application No. 62/910,826 filed on Oct. 4, 2019 titled "MULTIPLE OPTOELECTRONIC DEVICES WITH THERMAL COMPENSATION", which is incorporated herein by reference in its entirety.

BACKGROUND

The aspect ratios and fabrication methods of optoelectronic devices (e.g., tunable lasers and tunable laser transmitters) can result in excess real estate relative to the size of the optoelectronic device. For example, most single-mode tunable lasers and tunable laser transmitters have a waveguide ridge that is approximately 1 micron to 7 microns wide, whereas a typical transmitter chip on which the optoelectronic device is fabricated is configured for cleaving and handling and has a width in a range of 100 microns to 500 microns (e.g., in a range of 250 microns to 500 microns). A defect in any part of the optoelectronic device can cause the entire chip to be discarded, resulting in decreased yield and increased manufacturing costs.

Furthermore, a smaller foot print for the optoelectronic device may not be compatible with good thermal management. Accordingly, while larger chips with greater surface area can advantageously help with heat dissipation, such chips can have a larger amount of wasted space.

SUMMARY

In an aspect described herein, an apparatus (e.g., optical system) comprises at least a first optoelectronic device and a second optoelectronic device, the first and second optoelectronic devices in thermal communication with one another (e.g., the first and second optoelectronic devices are formed on the same substrate, wafer, or chip). The apparatus (optical system) further comprises an optical output port in optical communication with the first optoelectronic device and configured to be in optical communication with an optical system (e.g., via an optical adapter, optical fiber connector, or free space optical coupler; the optical system outside of a package or housing containing the first and second optoelectronic devices). The apparatus further comprises (e.g., within the package or housing) electrical (or electronic) circuitry in electrical communication with the first optoelectronic device, the electrical circuitry configured to provide first electrical signals to the first optoelectronic device, the first optoelectronic device responsive to the first electrical signals by generating optical signals and heat. The electrical circuitry is further in electrical communication with the second optoelectronic device, the electrical circuitry configured to provide second electrical signals to the second optoelectronic device, the second optoelectronic device responsive to the second electrical signals by generating heat. The electrical circuitry is configured to controllably adjust the first electrical signals and the second electrical signals to controllably adjust a temperature of the first optoelectronic device. The electrical circuitry is further configured to adjust the second electrical signals to control heat compensation produced by the second optoelectronic device.

In another aspect described herein, a method for fabricating an apparatus comprises providing a substrate comprising at least a first optoelectronic device and a second optoelectronic device, the first and second optoelectronic devices in thermal communication with one another. The method further comprises connecting the first and second optoelectronic devices to electrical circuitry configured to provide first electrical signals to the first optoelectronic device, the first optoelectronic device responsive to the first electrical signals by generating optical signals and heat. The electrical circuitry is further configured to provide second electrical signals to the second optoelectronic device, the second optoelectronic device responsive to the second electrical signals at least by generating heat. The electrical circuitry is further configured to control the first and second electrical signals such that a temperature of the first optoelectronic device is controlled (e.g., the temperature of the first optoelectronic device remains substantially constant). The method further comprises establishing an optical communication between the first optoelectronic device and an optical system and not establishing an optical communication between the second optoelectronic device and the optical system.

In another aspect described herein, a method for operating an apparatus comprises providing an apparatus comprising at least a first optoelectronic device and a second optoelectronic device, the first and second optoelectronic devices in thermal communication with one another. The method further comprises operating the first optoelectronic device to generate optical signals and heat and operating the second optoelectronic device to at least generate heat. The first and second optoelectronic devices are operated such that the heat generated by the first and second optoelectronic devices controls a temperature of the first optoelectronic device (e.g., the temperature of the first optoelectronic device) remains substantially constant. For examples, the temperature of the first device may be controlled such that a temperature of the first optoelectronic device (e.g., one or more sections of the first optoelectronic device) remain within ±1%, ±2%, ±3%, ±4%, ±5%, ±6%, ±7%, ±8%, ±10% or ±20% of a target temperature, or any range between any of these values.

In another aspect described herein, the designs of the first and second optoelectronic devices can be substantially similar to one another, such that each section of the second optoelectronic device has a part that can be biased to compensate heating resulting from providing an injection current to a corresponding section of the first optoelectronic device configure (e.g., packaged, provided with optical coupling elements) to provide optical signals. In another aspect described herein, one or more sections of the second optoelectronic device can be configured to provide temperature-controlled tuning of the one or more sections of the first optoelectronic device (e.g., for fast tuning of swept SGD-BRs) and/or to reduce or minimize thermal crosstalk between sections of the first optoelectronic device (e.g., to allow a comb mirror of the first optoelectronic device to be used as a reference).

DETAILED DESCRIPTION

Figure 1A:
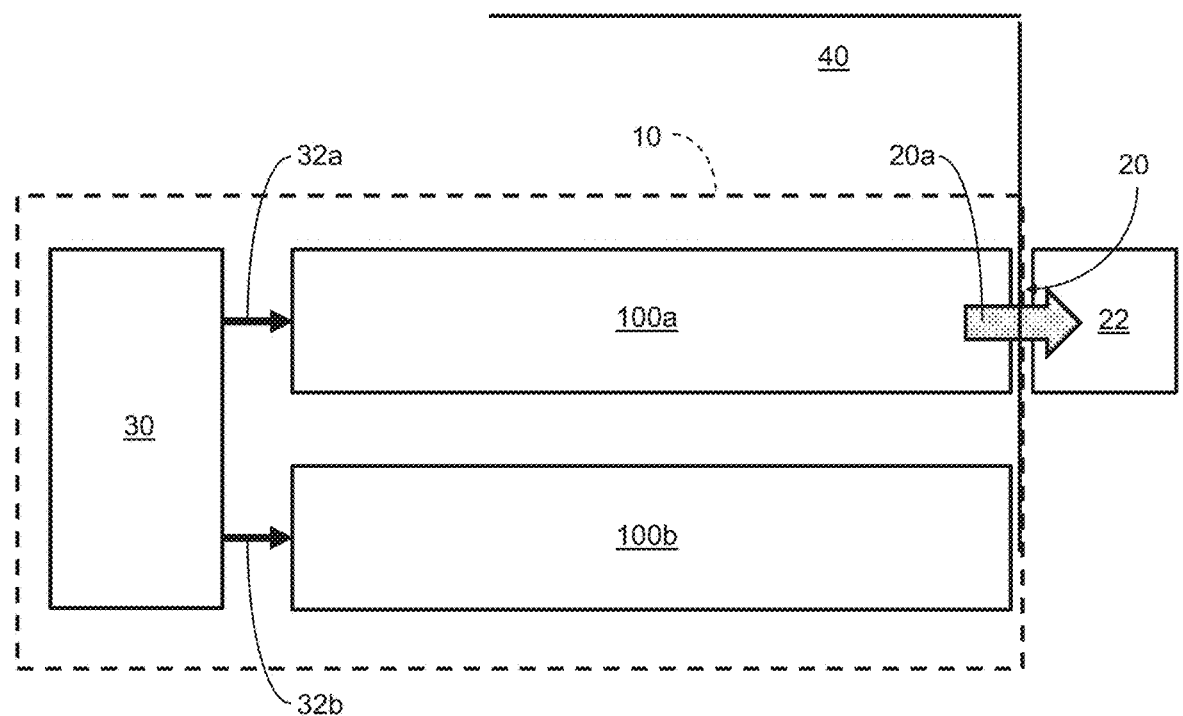
FIG. 1A illustrates an example apparatus comprising a first optoelectronic device, a second optoelectronic device and an electrical circuitry where the first optoelectronic device is in optical communication with an optical system.

Certain embodiments described herein advantageously utilize space on an optoelectronic chip (e.g., substrate; wafer) that would otherwise be wasted to improve the yield of usable devices. For example, the empty space on a substrate not occupied by a first optoelectronic device (e.g., a tunable laser or tunable laser transmitter) can be utilized by fabricating at least one second optoelectronic device (e.g., similar or identical to the first optoelectronic device) on the same chip (e.g., substrate; wafer) in thermal communication with the first optoelectronic device and using a selected one of the first and the at least one second optoelectronic devices to generate optical signals (e.g., selected based on the optical properties and/or performance of the first and the at least one second optoelectronic devices) and using the other of the first and at least one second optoelectronic device to provide thermal compensation for the first optoelectronic device. By including the at least one second optoelectronic device on the available excess real estate and allowing one of the two or more optoelectronic devices to be selected to generate optical signals, the chip yield can be increased and manufacturing costs can be decreased. Additionally, the optoelectronic device selected for providing heat compensation may improve the performance of the optoelectronic, device selected for generating optical signals, by stabilizing a temperature of one or more sections of the optoelectronic device selected for generating optical signals. In some examples, stabilizing the temperature of one or more sections of the optoelectronic device selected for generating optical signals, may facilitate tuning or adjusting the wavelength of optical signals (e.g., enable monotonous wavelength tuning within a given wavelength range). In some examples, stabilizing the temperature of one or more sections of the optoelectronic device selected for generating optical signals, may improve the stability of a power or an intensity of the generated optical signals. For example, the heat compensation provided by the optoelectronic device, selected for heat compensation, may maintain the optical intensity or optical power within ±1%, ±2%, ±3%, ±4%, ±5%, ±6%, ±7%, ±8%, ±10% or ±20% of a target optical intensity or optical power, or any range between any of these values. In some examples, stabilizing the temperature of one or more sections of the optoelectronic device, selected for generating optical signals, may improve the stability of a wavelength of optical signals. For example, the heat compensation provided by the second optoelectronic device may maintain the wavelength of the optical signals within ±1%, ±2%, ±3%, ±4%, ±5%, ±6%, ±7%, ±8%, 10% or ±20% of a target wavelength, or any range between any of these values.

Certain embodiments described herein provide an advantageous improvement in yield. For example, if a defect in one of the two or more optoelectronic devices occurs, another non-defective optoelectronic device of the two or more optoelectronic devices can be used for generating optical signals, while the defective optoelectronic device can be used (e.g., primarily or solely) for thermal compensation of the non-defective optoelectronic device. For another example, if one of the two or more optoelectronic devices is sub-optimal, another optimal optoelectronic device of the two or more optoelectronic devices can be used to generate optical signals (e.g., packaged to provide optical signals), while the sub-optimal optoelectronic device is used (e.g., primarily or solely) for thermal compensation of the optimal optoelectronic device that is generating optical signals. For still another example, the two or more optoelectronic devices can have different designs from one another (e.g., variations of parameter space for the different optoelectronic devices), and the optoelectronic device having a preferred, better, best, etc. operation (e.g., such as higher or lower based on a selected metric, for example, temporal variation of an optical intensity or optical power and/or wavelength of the optical signals generated by the optoelectronic device.) among the two or more optoelectronic devices can be used to generate optical signals (e.g., packaged to provide optical signals), while an optoelectronic device not having the preferred, better or best operation (e.g., such as higher or lower based on a selected metric, for example, temporal variation of an optical intensity or optical power and/or wavelength of the optical signals generated by the optoelectronic device) is used (e.g., primarily or solely) for thermal compensation of the optoelectronic device having the preferred, better or best optical operation and that is generating optical signals. For yet another example, the two or more optoelectronic devices can have different designs from one another, and the optoelectronic device having the desired operation can be used (e.g., packaged to provide optical signals), while an optoelectronic device not having the desired operation is used (e.g., primarily or solely) for thermal compensation of the optoelectronic device having the desired operation, resulting in an advantageous improvement in inventory management.

Figure 1B:
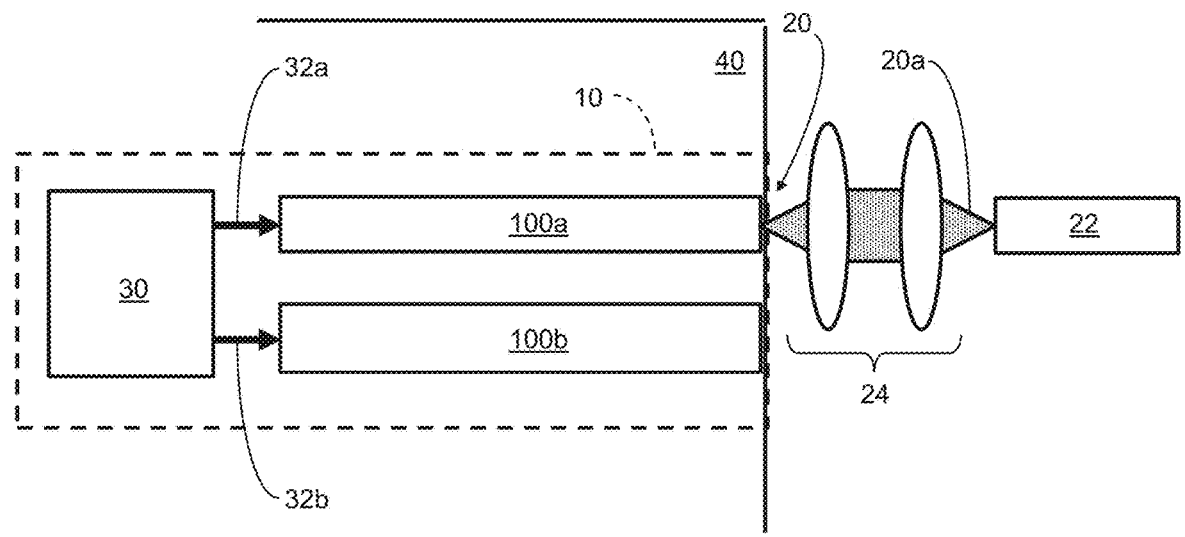
FIG. 1B illustrates an example apparatus comprising a first optoelectronic device, a second optoelectronic device and an electrical circuitry where the first optoelectronic device is in optical communication with an optical system via an optical coupler.

FIGS. 1A and 1B schematically illustrate an example apparatus 10 in accordance with certain embodiments described herein. The apparatus 10 comprises at least a first optoelectronic device 100a and a second optoelectronic device 100b, the first and second optoelectronic devices 100a, 100b in thermal communication with one another (e.g., the first and second optoelectronic devices 100a, 100b are formed on the same chip 40 (e.g., substrate; wafer). The apparatus 10 further comprises an optical output port 20 in optical communication with the first optoelectronic device 100a and configured configure to output light or optical signals generated by the first optoelectronic device 100a. In some embodiments, the optical output port may configured to be in optical communication with an optical system 22 (e.g., via an optical coupler 24).

The apparatus 10 further comprises electrical circuitry 30 in electrical communication with the first optoelectronic device 100a, the electrical circuitry 30 configured to provide first electrical signals 32a to the first optoelectronic device 100a, the first optoelectronic device 100a responsive to the first electrical signals 32a by generating optical signals 20a and heat. The electrical circuitry 30 is further in electrical communication with the second optoelectronic device 100b, the electrical circuitry 30 configured to provide second electrical signals 32b to the second optoelectronic device 100b, the second optoelectronic device 100b responsive to the second electrical signals 32b by generating heat. The electrical circuitry 30 is configured to controllably adjust the first electrical signals 32a and the second electrical signals 32b to controllably adjust a temperature of the first optoelectronic device 100a.

In certain embodiments, one or both of the first optoelectronic device 100a and the second optoelectronic device 100b comprises a tunable laser. For example, the tunable laser can include a waveguide with active and passive sections including at least one mirror (or optical reflector) comprising an optical grating, at least one optical gain section, and at least one output facet. In some examples, the output face may be partially reflecting. For another example, the tunable laser can include two mirrors (optical reflectors), a phase section, and an optical gain section. For still another example, the tunable laser can include a semiconductor optical amplifier (SOA) (e.g., the first optoelectronic device 100a can include a distributed feedback laser with an SOA output, where wavelength tuning and power tuning can be thermally compensated by the second optoelectronic device 100b) and/or an electro-absorption modulator. In certain other embodiments, one or both of the first optoelectronic device 100a and the second optoelectronic device 100b may comprise a tunable laser transmitter (e.g., a tunable laser with an optical modulator).

Figure 2A:
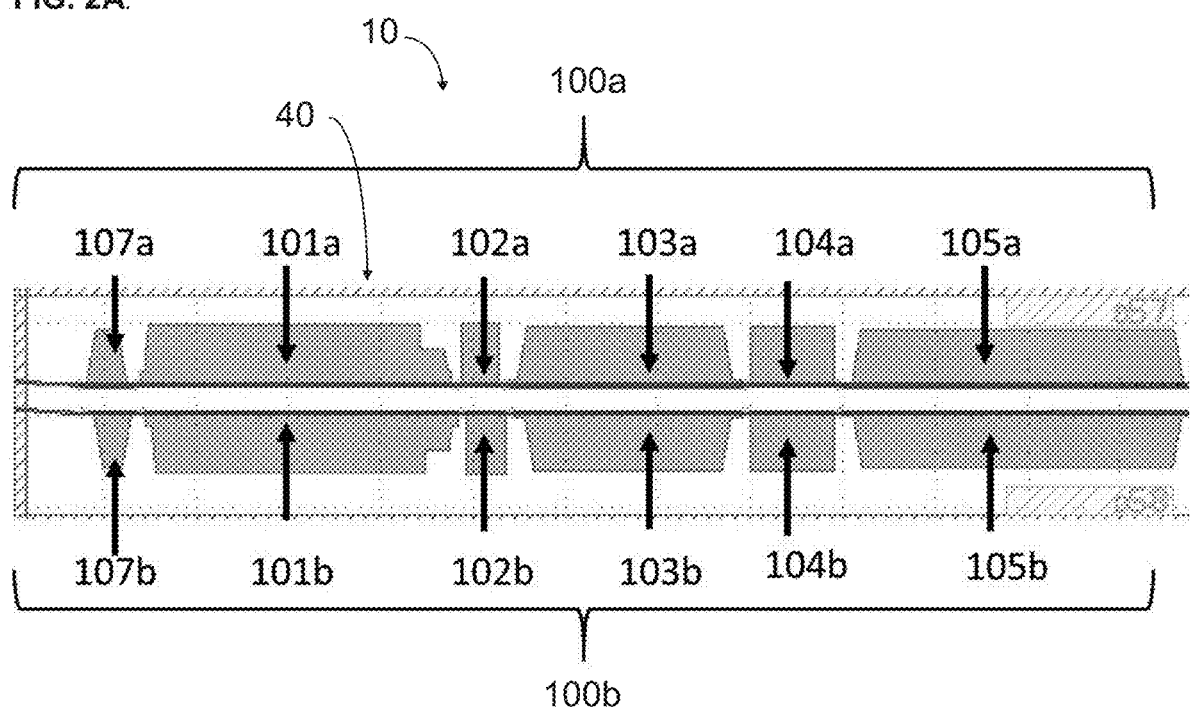
FIG. 2A illustrates a top view of an example chip with a first tunable laser and a second tunable laser where each tunable laser include two mirrors, a phase section, a gain section, an optical amplifier, and a rear absorber.
Figure 2B:
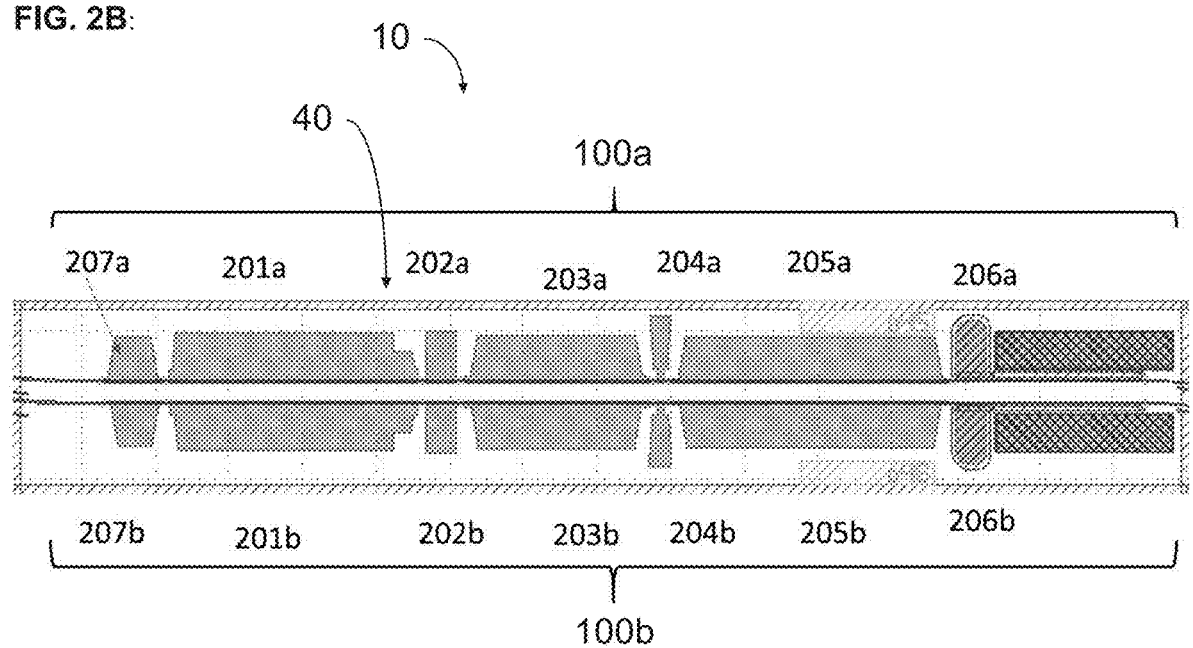
FIG. 2B illustrates a top view of an example chip with a first tunable laser transmitter and a second tunable laser transmitter where each tunable laser transmitter include two mirrors, a phase section, a gain section, an optical amplifier, a rear absorber and a modulator.

FIG. 2A schematically illustrates a top view of an example apparatus 10 in accordance with certain embodiments described herein. In FIG. 2A, the first and second optoelectronic devices 100a, 100b each comprise a tunable laser. In FIG. 2B, the first and second optoelectronic devices 100a, 100b each comprise a tunable laser transmitter. In FIGS. 2A and 2B, the two optoelectronic devices 100a, 100b are fabricated on a single chip 40. For example, the single chip 40 can have a minimum fabrication size (e.g., due to manufacturing constraints, the chip 40 would not be any smaller in footprint if it comprised only a single optoelectronic device). In certain embodiments, the two optoelectronic devices 100a, 100b (e.g., tunable lasers; tunable laser transmitters) are included on a single chip 40 that would otherwise have supported a single optoelectronic device. Similarly, in certain embodiments, the two optoelectronic devices 100a, 100b (e.g., tunable lasers; tunable laser transmitters) are included on a single chip 40 that would otherwise have supported two or more optoelectronic devices.

As schematically illustrated by FIG. 2A, in some embodiments, the first optoelectronic device 100a comprises a tunable laser including two first mirrors 101a, 104a, a first phase section 102a, a first gain section 103a, a first semiconductor optical amplifier 105a, and a first rear absorber 107a. The second optoelectronic device 100b can be fabricated in a portion of the chip 40 that would otherwise be unused and the second optoelectronic device 100b can be similar (e.g., identical) to the first optoelectronic device 100a. For example, the second optoelectronic device 100b can comprise components that would be equally useful as a tunable laser, which as shown in FIG. 2A, can include two second mirrors 101b, 104b, a second phase section 102b, a second gain section 103b, a second semiconductor optical amplifier 105b, and a second rear absorber 107b. As schematically illustrated by FIG. 2B, the first optoelectronic device 100a comprises a tunable laser transmitter including two first mirrors 201a, 204a, a first phase section 202a, a first gain section 203a, a first semiconductor optical amplifier 205a, a first rear absorber 207a, and a first modulator 206a. The second optoelectronic device 100b can be fabricated in a portion of the chip 40 that would otherwise be unused and the second optoelectronic device 100b can be similar (e.g., have the same components of the similar or the same or identical size and/or shape or other characteristics such as electrical, material, or spatial characteristics) to the first optoelectronic device 100a. For example, the second optoelectronic device 100b can comprise components that would be equally useful as a tunable laser transmitter, which as shown in FIG. 2B, can include two second mirrors 201b, 204b, a second phase section 202b, a second gain section 203b, a second semiconductor optical amplifier 205b, a second rear absorber 207b, and a second modulator 206b. In some embodiments, an optoelectronic device may comprise plurality of sections. In some such embodiments, each section may comprise one or more components (e.g., mirror, optical reflector, phase shifter, optical amplifier, optical absorber, optical gain and the like). In some cases, one or more temperature sensors may be included (e.g., monolithically integrated) with an optoelectronic device. In some such cases, one or more sections, possibly most or even each section, may include a temperature sensor that may be used to monitor or measure the temperature of that section. A temperature sensor can be, for example, a thermistor, a thermocouple, or a semiconductor temperature sensor (e.g., a semiconductor junction).

Due to the aspect ratios of the first and second optoelectronic devices 100a, 100b, and the constraints imposed by packaging and cleaving systems, the practical and convenient chip size is much larger than the size of the individual first optoelectronic device 100a. Thus, there may be a significant amount of space on the chip 40 that is unused and does not include any optoelectronic components and/or functional blocks included in the first optoelectronic device 100a.

In certain embodiments, the two optoelectronic devices 100a, 100b are tested (e.g., prior to further packaging). If a defect in one of the two optoelectronic devices 100a, 100b renders it unusable for generating optical signals, it is possible that the other of the two optoelectronic device 100a, 100b is usable for generating optical signals, and further packaging comprises configuring the usable optoelectronic device for electrical connection (e.g., in electrical communication with circuitry 30) and for optical connection (e.g., in optical communication with optical system 22), while the unusable optoelectronic device is not configured for generating optical signals. In certain embodiments, the two optoelectronic devices 100a, 100b are tested (e.g., prior to further packaging), and the optoelectronic device with certain optical performance may be selected for optical connection, while the other optoelectronic device ultimately is not used for generating optical signals.

In certain embodiments, if the first optoelectronic device 100a is tested and meets all requirements, testing of the second optoelectronic device 100b can be omitted (e.g., is not required), and the first optoelectronic device 100a can selected to be electrically connected to an electrical circuit and to be in optical communication with an optical system, while the second optoelectronic device 100b, although it may be operational (e.g., capable of generating optical signals), may not be configured for generating optical signals. In some examples, the second optoelectronic device may generate light or optical signals but not being optical communication with an optical system. In some examples, current may be provided only to selected sections of the second optoelectronic device (e.g., to generate heat and provide heat compensation for the second optoelectronic device).

In certain embodiments, designing and manufacturing optoelectronic devices (e.g., tunable lasers; tunable laser transmitters) can advantageously provide two slightly different optoelectronic devices (e.g., different versions of the same optoelectronic device) that can be simultaneously fabricated. For example, during a testing phase in which the two optoelectronic devices 100a, 100b are tested (e.g., by measuring an intensity, power or a wavelength of optical signals generated by the optoelectronic device), one of the two optoelectronic devices 100a, 100b can be selected based on the test results and on the desired application. The one of the two optoelectronic devices with better optical performance can be selected to be further configured to be in optical communication with an optical system 22 (e.g., via an output optical fiber) while the other non-selected optoelectronic device, although present on the chip 40 and in the device package, is not in optical communication with the optical system 22. In certain such embodiments, both the selected optoelectronic device and the non-selected optoelectronic device are provided with electrical connections and input electrical signals, with the non-selected optoelectronic device used to provide temperature control for the selected optoelectronic device. In some examples, an optical performance may be measured at least in part based on a measured intensity or power of the optoelectronic device and/or a measured wavelength of the optoelectronic device. In some examples an optical performance may be measured at least in part based on a temporal variation of measured intensity or power of the optoelectronic device and/or a temporal variation of the measured wavelength of the optoelectronic device. In some cases, a better performance is a measured performance that is different from another measured performance by a threshold value.

In certain embodiments, operation of the optoelectronic device that is in optical communication with the optical system 22 via the optical output port 20 (e.g., the first optoelectronic device 100a) comprises adjusting (e.g., changing; tuning; modifying) at least one electrical signal 32a (e.g., electrical currents) provided to at least one component of the first optoelectronic device 100a. Such adjustments of the at least one electrical current or voltage provided to the optoelectronic device can be used to, for example, adjust a wavelength of the optical signals generated by the optoelectronic device or to adjust the intensity or power of light output by the optoelectronic device. In some cases, an adjustment of the at least one electrical current or voltage provided to the optoelectronic device may comprise modulating the electrical current of the electrical voltage at a modulation frequency. In some examples the modulation frequency can be from 1 Hz to 100 Hz, 100 Hz to 1 KHz, 1 KHz to 100 KHz, 100 KHz to 1 MHz, 1 MHz to 100 MHz, 100 MHz to 1 GHz, 1 GHz to 10 GHz, or 10 GHz to 50 GHz or any range formed by any of these values.

In some cases, an adjustment of the at least one electrical current or voltage provided to the optoelectronic device can be used to compensate for aging of an active material in at least one component (e.g., gain section; phase section; one or more mirrors) over the lifetime of the optoelectronic device.

Figure 3:
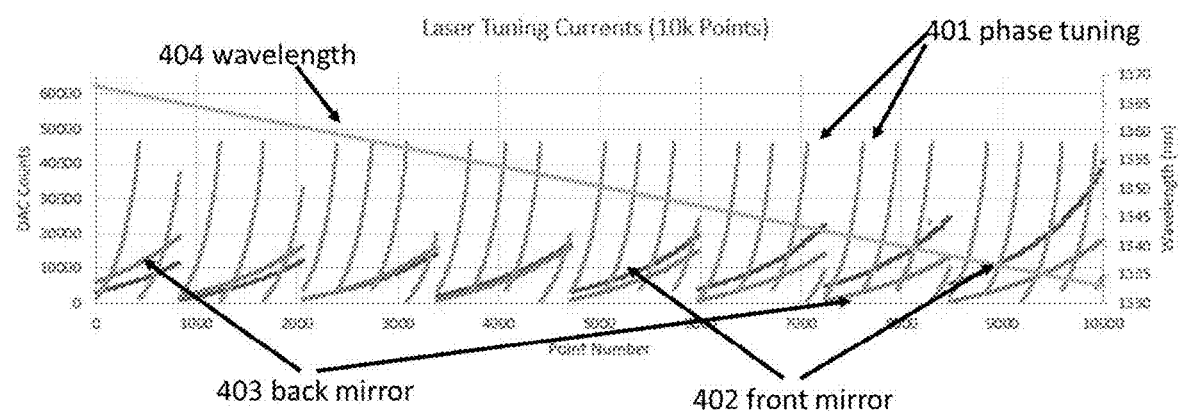
FIG. 3 illustrates example relative changes to injection electrical currents provide to the front mirror, back mirror, and phase section of a tunable laser or tunable laser transmitter to tune the wavelength of the an optical signal generated by the tunable laser transmitter.

In some embodiments, at least one injection electrical current can be adjusted so as to sweep the first optoelectronic device 100a (e.g., Vernier-tuned tunable laser) through a continuum of wavelengths within a predetermined wavelength range. FIG. 3 schematically illustrates example relative changes to injection electrical currents provided to the front mirror 104a, back mirror 101a, and phase section 102a of a first optoelectronic device 100a in accordance with certain embodiments described herein. This ramping of the injection electrical currents provided to the front mirror 104a, back mirror 101a, and the phase section 102a can be complex, and in certain embodiments, electrical currents provided to the gain section 103a and/or the SOA 105a are also tuned to maintain power as the wavelength is adjusted. FIG. 3 shows the variation of the wavelength 404 of an example optoelectronic device (e.g., the first optoelectronic device 100a) as a result of adjusting the electrical current 401 provided to the phase section 102a for phase tuning, the electrical current 402 provided to the front mirror 104a, and the electrical current 403 provided to the back mirror 101a. In this plot, the x-axis represent points in time, the left-most y-axis represents the magnitude of electrical currents 401 provided to the phase section 102a for phase tuning, the electrical current 402 provided to the front mirror 104a, and the electrical current 403 provided to the back mirror 101, and the right-most y-axis represents the wavelength 404 of the first optoelectronic device 100a. FIG. 0.3 shows that various currents provided to an optoelectronic device (e.g., the first optoelectronic device) may need to be adjusted in a complex manner in order to change the wavelength monotonously (e.g., as a linearly decreasing function) while maintaining the optical output power constant or within a limited or predefined range.

Figure 4:
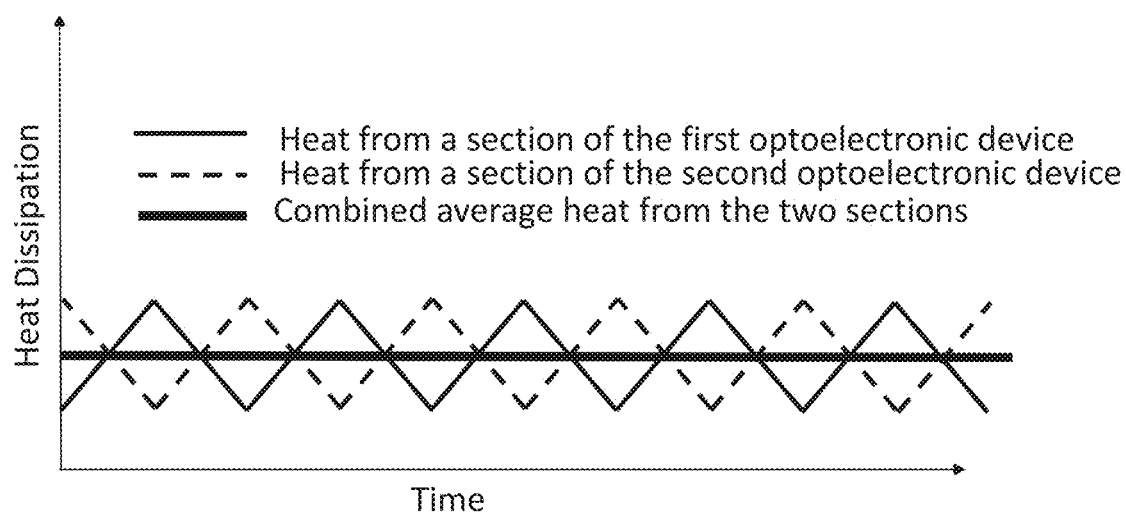
FIG. 4 illustrates heat generated by a section of a first optoelectronic device, heat generated by a section of a second optoelectronic device and combined heat generated by the two sections when injection electrical currents provided to the section of the first optoelectronic device and to the section of the second optoelectronic device are modulated with opposite phase.

These changing injection electrical currents provided to various portions of the first optoelectronic device 100a induce corresponding temperature changes over time. Such temperature changes could affect the operation of the first optoelectronic device 100a. In some examples, these changing temperatures may interfere with the wavelength adjustment process and make it difficult to control the wavelength of the first optoelectronic device. Advantageously, in certain embodiments, the second optoelectronic device 100b may be used to reduce (e.g., prevent; mitigate; minimize) these temperature-induced effects by providing thermal compensation. In some embodiments, one or more second injection currents may be provided to one or more sections or components of the second optoelectronic device such that the heat exchange between the first optoelectronic device and the second optoelectronic device results in a constant or nearly constant temperature of one or more sections or the components of the first optoelectronic device that are adjusted using one or more first injection currents. For example, FIG. 4 schematically illustrates the temporal variation of heat dissipated or generated by a section of the first optoelectronic device and a section of the second optoelectronic device. In this example, the heat from each section could be generated as a result of modulating a first injection electrical current provided to a section of the first optoelectronic device 100a (e.g., a laser with its optical output 20 in optical communication with an optical system 22 and in electrical communication with the electrical circuitry 30) and modulating the second injection electrical current provided to a section of the second optoelectronic device 100b (e.g., a laser that is not in optical communication with the optical system 22 and that is in electrical communication with the electrical circuitry 30) in accordance with certain embodiments described herein. While the second optoelectronic device 100b is not in optical communication with the optical system 22 (e.g., optical signals generated by the second optoelectronic device 100b are unused), at least one injection electrical current provided to the second optoelectronic device 100b is used to compensate the changing heat generated by the first optoelectronic device 100a (e.g., to keep the temperature of the first optoelectronic device 100a within a predetermined range). As shown in FIG. 4, the summed heat generated and dissipated by both the first optoelectronic device 100a and the second optoelectronic device 100b is controlled (e.g., substantially constant; adjusted among different values) over time such that the temperature of the first optoelectronic device 100a is controlled (e.g., substantially constant; adjusted to a desired value or adjusted to remain within a particular range) over time.

In certain embodiments, the substantially constant temperature is maintained regardless of the drive currents being sourced to the first optoelectronic device 100a (e.g., the selected laser), which as described above, can change as a function of time. As one or more electrical currents provided to one or more sections of the first optoelectronic device 100a (e.g., currents to one or more sections 101a-107a) are driven downwards or upwards from a nominal value to tune or control the first optoelectronic device 100a (e.g., the laser wavelength, power, and/or side mode suppression ratio), one or more electrical currents provided to one or more corresponding sections of the second optoelectronic device 100b (e.g., currents to one or more sections 101b-107b) are driven by a similar amount upwards or downwards (or by an amount having a similar effect) in the opposite direction. Thus, in certain embodiments, by providing an opposite bias to the corresponding section of the second optoelectronic device 100b that is adjacent to the section of the first optoelectronic device 100a having the changing bias, the thermal load in any region of the chip 40 can remain substantially constant so that the temperature of the first optoelectronic device 100a remains substantially constant (e.g., does not vary significantly with changes to the device bias).

In certain embodiments, the first optoelectronic device 100a and the second optoelectronic device 100b are paired (e.g., mirror imaged) to one another on the chip 40 (and/or grouped and/or sufficiently close) such that the waveguides of the two optoelectronic devices 100a, 100b are in thermal communication with one another (e.g., spaced by a distance in a range of 2 microns to 100 microns; spaced by less than 100 microns) to improve uniformity of constant thermal load. In certain embodiments, the injection currents in one or more pairs of local sections (e.g., sections 101a, 101b; sections 102a, 102b; etc.) are balanced to compensate one another, thereby promoting or ensuring constant thermal load and enhanced temperature stability. In certain embodiments, thermal compensation is provided by pairing only a subset (e.g., one or two) of the sections 101a-107a of the first optoelectronic device 100a with corresponding sections 101b-107b of the second optoelectronic device 100b, while in certain other embodiments, thermal compensation is provided by pairing all of the sections 101a-107a of the first optoelectronic device 100a with corresponding sections 101b-107b of the second optoelectronic device 100b.

Figure 5A:
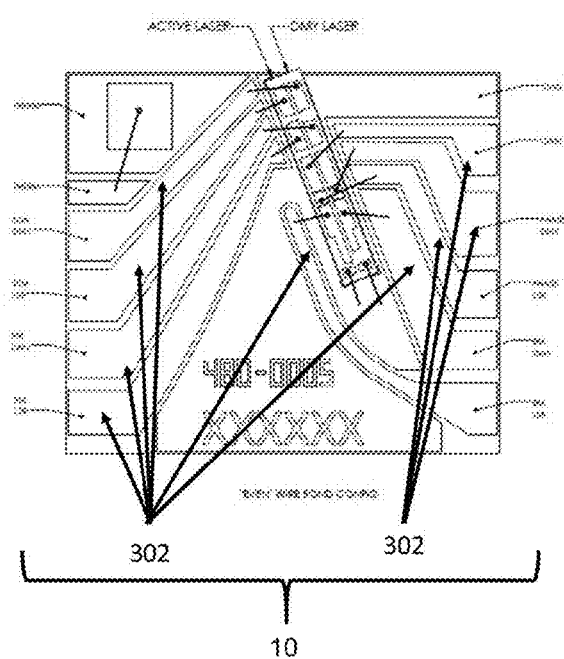
FIG. 5A schematically illustrates a configuration of a chip comprising two optoelectronic devices mounted on a carrier and wire bonded to the electrical ports of a carrier such that device on the left is wire bonded to ports for the active device, and the device on the right is wire bonded to ports for the compensation heat control.
Figure 5B:
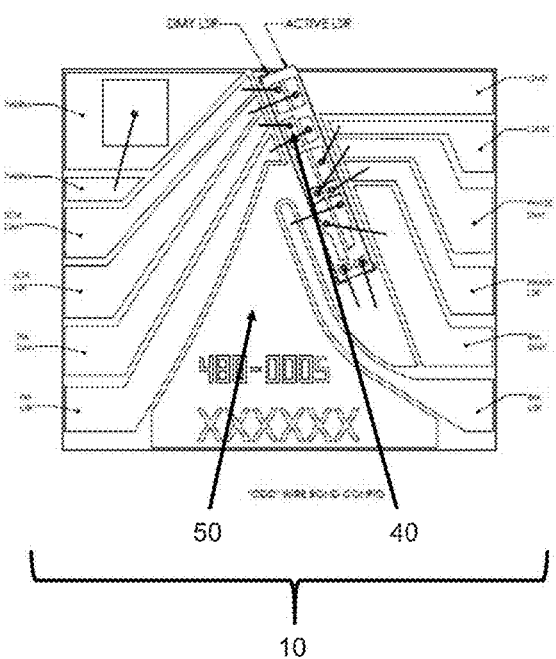
FIG. 5B schematically illustrates a configuration of a chip comprising two optoelectronic devices mounted on a carrier and wire bonded to the electrical ports of a carrier such that the device on the right is wire bonded to ports for the active device, and the device on the left is wire bonded to ports for the compensation heat control

FIGS. 5A and 5B schematically illustrate two configurations of a chip 40 comprising two optoelectronic devices in accordance with certain embodiments described herein. The chip 40 (comprising, for example, III-V semiconductor material) is mounted on (e.g., soldered; epoxied; otherwise attached to) a carrier 50 (e.g., substrate) for thermal and mechanical stability. Either of the two optoelectronic devices on the chip 40 can be selected for optical connection to be used as the first optoelectronic device 100a (e.g., labeled "active laser" in FIGS. 5A and 5B) while the other of the two optoelectronic devices is selected to balance the thermal load to be used as the second optoelectronic device 100b (e.g., labeled "dmy laser" in FIGS. 5A and 5B). In certain embodiments, the selection is arbitrary, with the first optoelectronic device 100a interchangeable with the second optoelectronic device 100b. The two configurations of FIGS. 5A and 5B can be attained by using the same chip 40 and optoelectronic devices but with different connection configurations for the two configurations. For example, in the apparatus 10 of FIG. 5A, the left-most optoelectronic device on the chip 40 is wire bonded or otherwise connected to electrical ports 302 for the active device (e.g., first optoelectronic device 100a), and is subsequently optically connected to the optical system 22, while the right-most optoelectronic device on the chip 40 is wire bonded or otherwise connected to electrical ports for the compensation heat control (e.g., load-balancing) device and is not subsequently optically connected to the optical system 22. For another example, in the apparatus 10 of FIG. 5B, the right-most optoelectronic device on the chip 40 (e.g., first optoelectronic device 100a) is wire bonded or otherwise connected to electrical ports 302 for the active device, and is subsequently optically connected to the optical system 22, while the left-most optoelectronic device on the chip 40 is wire bonded or otherwise connected to electrical ports for the compensation heat control (e.g., load-balancing) device and is not subsequently optically connected to the optical system 22. In the configurations of FIGS. 5A and 5B, the roles of the two optoelectronic devices are switched relative to one another.

In certain embodiments, the electrical ports 302 are configured such that either of the configurations of FIGS. 5A and 5B can be readily implemented in the manufacturing process. In certain embodiments, one of the optoelectronic devices can have poor optical performance or not being optically functional (e.g., not being able to generate optical signals), but can still be electrically functional for generating heat for thermal compensation, and the selection of which of the configurations of FIGS. 5A and 5B is used can be based on a determination of which of the two optoelectronic devices has the preferred, better, best, etc., optical performance (e.g., such as higher or lower based on based on a selected metric such as: temporal variation of an intensity or power and/or wavelength of the optical signals generated by the optoelectronic device). In certain such embodiments, a higher yield of chips with thermal compensation is provided. In some examples, a better optical performance is an optical performance that is different from another optical performance by a threshold amount.

Figure 6:
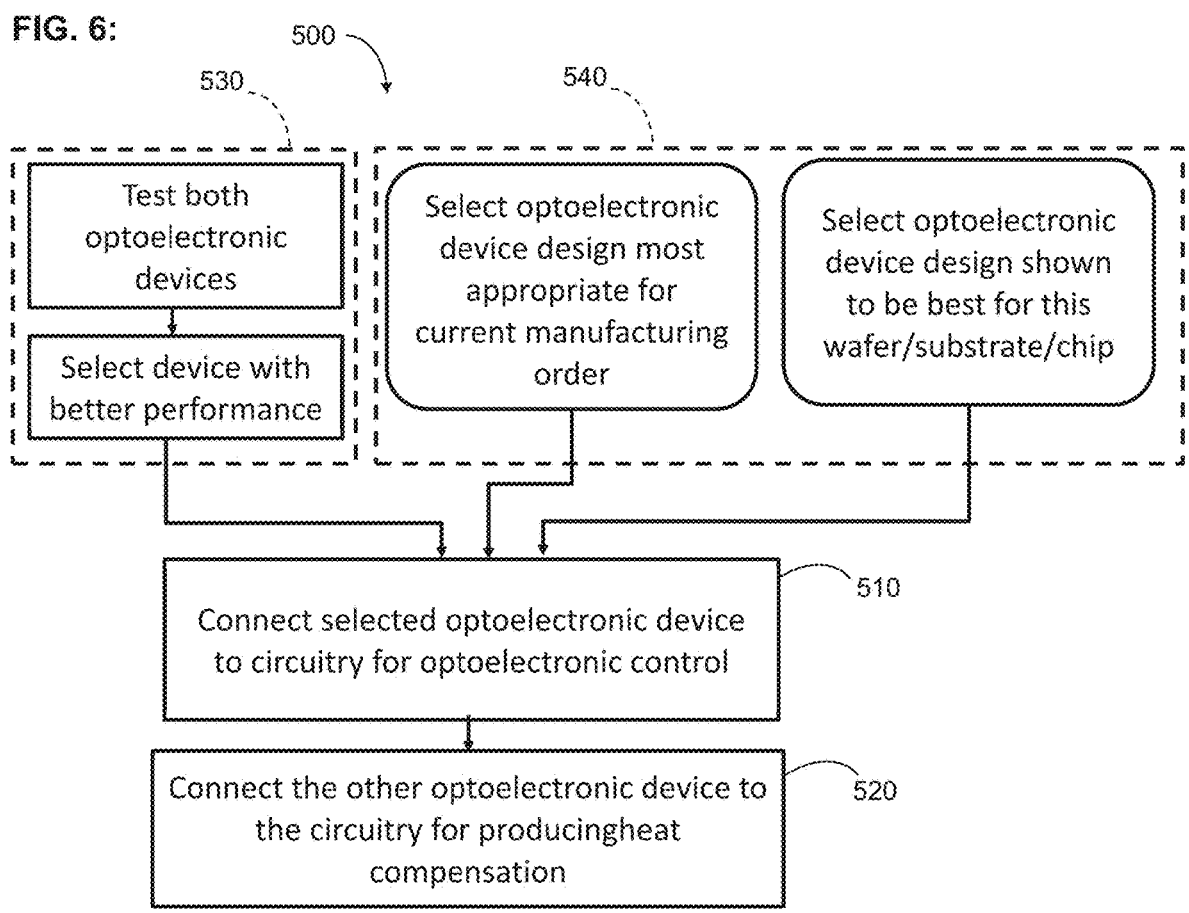
FIG. 6 is a flow diagram of an example fabrication method of an apparatus comprising two optoelectronic devices by selecting and connecting first optoelectronic device to a circuitry for optoelectronic control and selecting and connecting a second optoelectronic device to a circuitry for producing heat compensation for the first optoelectronic device.

FIG. 6 is a flow diagram of an example method 500 in accordance with certain embodiments described herein.

In an operational block 510, the method 500 comprises connecting a first optoelectronic device 100a to electrical circuitry 30. The electrical circuitry 30 is configured to provide first electrical signals 32a to the first optoelectronic device 100a, the first electrical signals 32a configured to control optoelectronic operation of the first optoelectronic device 100a (e.g., to control the generation of optical signals 20a by the first optoelectronic device 100a). In an operational block 520, the method 500 further comprises connecting a second optoelectronic device 100b to the electrical circuitry 30. The electrical circuitry 30 is further configured to provide second electrical signals 32b to the second optoelectronic device 100b, the second electrical signals 32b configured to control heat compensation by the second optoelectronic device 100b. For example, the second electrical signals 32b can be configured to operate the second optoelectronic device 100b to generate a thermal load that is summed with a thermal load from the first optoelectronic device 100a such that a temperature of the first optoelectronic device 100a is controlled (e.g., substantially constant, with in a range) during operation of the first optoelectronic device 100a. In certain embodiments, the method 500 further comprises connecting an optical output port 20 of the first optoelectronic device 100a to an optical input port of an optical system 22 (e.g., via an optical coupler 24). In some examples, the optical output port may be connected to an optical connector (e.g., fiber optic connector) that is connected to optically coupled to the optical system. In some such examples the optical output port may be connected to an intermediary optical component (e.g., an optical adapter, a mode matching component and the like). In some other examples, the optical output port can be a facet or a mirror that couples light from the optoelectronic device to free space. In some such examples, the light coupled out by the output port may be coupled to an optical system using an intermediary optical system (e.g., comprising one or more one or more optical components such as lenses, polarizers, and the like).

In certain embodiments, the method 500 comprises selecting one of two optoelectronic devices to use as the first optoelectronic device 100a. For example, in an operational block 530, the optical performance of both of the optoelectronic devices can be tested, and the optoelectronic device having the better, best, etc. optical performance (e.g., such as higher or lower based on a selected metric such as: temporal variation of an intensity or power and/or wavelength of the optical signals generated by the optoelectronic device) can be selected to use as the first optoelectronic device 100a. In some embodiments, testing the optoelectronic device may include but limited to: measuring the intensity or power of light output by the optoelectronic device as a function of one or more drive currents provided to the optoelectronic device, measuring the wavelength of light output by the optoelectronic device as a function of one or more drive currents provided to the optoelectronic device, measuring an optical modulation depth as a function of one or more modulating signals provided to optoelectronic device, monitoring the intensity or power of light output by the optoelectronic device over a period of time and the like. In some such embodiments, an optical performance of the optoelectronic device may be determined based at least in part on the measured intensity or power, measured optical modulation depth, variations in the intensity or power of measured light overtime and the like. In some examples, the testing procedure may comprise testing a first optical performance of the first optoelectronic device and a second optical performance of the second optoelectronic device. In some such examples, a better, best, etc. optical performance may comprise an optical performance that is different than another optical performance by a threshold amount.

In certain embodiments, the method 500 comprises selecting the first optoelectronic device 100a based on a design (e.g., the design most appropriate for the current manufacturing order and/or the design that is different than other designs on the same wafer/substrate/chip) of the first optoelectronic device in an operational block 540. In some examples, a design difference may be related to the size and shape of certain features of the device. For example, design differences between the first and second optoelectronic devices 100a, 100b can result in operational differences that make one device more useful for the particular application or operation of the apparatus 10 and the other device more useful for a different application or different operation. The determination of operational differences can be made after testing both the first and second optoelectronic devices 100a, 100b or can be based on the design differences, without testing both devices, where the design differences are known to result in operational differences or probabilities of operational differences. In some examples, the design difference can be a design of the fabricated device and can be associated with fabrication process. In some such examples, the design difference may be related to process variation from one wafer or substrate to another wafer or substrate. The device considered to be more useful for the particular operation of the apparatus 10 can be selected to be used as the first optoelectronic device 100a of the apparatus 10 while the other device considered to be more useful for a different application may be selected to be used as the second optoelectronic device 100b of the apparatus 10.

In some embodiments, once a first optoelectronic device is selected for generating optical signals, a second optoelectronic device is selected for producing heat compensation for the first optoelectronic device, and both optoelectronic devices are electrically connected to the electrical circuitry, the electrical circuitry may be configured, for example, by measuring temperatures of one or more sections of the first optoelectronic device. In some such embodiments, the electrical circuitry can be adjusted to provide electrical signals to the second optoelectronic device in order to maintain the measured temperature of one or more sections of the first optoelectronic device within a given temperature range while the first optoelectronic device is operational (e.g., generating optical signals, generating optical signals with varying intensity or power, generating optical signals with varying wavelengths and the like). In some examples, the temperature of one or more sections of the first optoelectronic device may be measured using one or more temperature sensors (e.g., thermistors, thermocouples, semiconductor temperature sensors or RTDs, and the like). In some such examples, the temperature sensors may be integrated with the first optoelectronic device. In some other examples, one or more temperature sensors may be temperature probes in thermal communication with one or more sections of the first optoelectronic device.

In some embodiments, once a first optoelectronic device is selected for generating optical signals, a second optoelectronic device is selected for producing heat compensation for the first optoelectronic device, and both optoelectronic devices are electrically connected to the electrical circuitry, the electrical circuitry may be configured, for example, by measuring the wavelength of the light generated by the first optoelectronic device. In some such embodiments, the electrical circuitry can be adjusted to provide electrical signals to the second optoelectronic device to enable tuning the measured wavelength within a given wavelength range. In some examples, enabling tuning the measured wavelength within a given wavelength range may comprise tuning the wavelength continuously within a wavelength range. In some examples, the wavelength of the optical signal generated by the first optoelectronic device may be measured using an optical spectrometer that is in optical communication with eth first optoelectronic device (e.g., via an output port of the first optoelectronic device).

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments.

Conjunctive language such as the phrase "at least one of X, Y, and Z," unless specifically stated otherwise, is to be understood within the context used in general to convey that an item, term, etc. may be either X, Y, or Z. Thus, such conjunctive language is not generally intended to imply that certain embodiments require the presence of at least one of X, at least one of Y, and at least one of Z.

Language of degree, as used herein, such as the terms "approximately," "about," "generally," and "substantially," represent a value, amount, or characteristic close to the stated value, amount, or characteristic that still performs a desired function or achieves a desired result. For example, the terms "approximately," "about," "generally," and "substantially" may refer to an amount that is within ±10% of, within ±5% of, within ±2% of, within ±1% of, or within ±0.1% of the stated amount. As another example, the terms "generally parallel" and "substantially parallel" refer to a value, amount, or characteristic that departs from exactly parallel by ±10 degrees, by ±5 degrees, by ±2 degrees, by ±1 degree, or by ±0.1 degree, and the terms "generally perpendicular" and "substantially perpendicular" refer to a value, amount, or characteristic that departs from exactly perpendicular by ±10 degrees, by ±5 degrees, by ±2 degrees, by ±1 degree, or by ±0.1 degree.

Various configurations have been described above. Although this invention has been described with reference to these specific configurations, the descriptions are intended to be illustrative of the invention and are not intended to be limiting. Various modifications and applications may occur to those skilled in the art without departing from the true spirit and scope of the invention. Thus, for example, in any method or process disclosed herein, the acts or operations making up the method/process may be performed in any suitable sequence and are not necessarily limited to any particular disclosed sequence. Features or elements from various embodiments and examples discussed above may be combined with one another to produce alternative configurations compatible with embodiments disclosed herein. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. An apparatus comprising:
   a first optoelectronic device configured to generate optical signals;
   a second optoelectronic device in thermal communication with the first optoelectronic device;
   an optical output port in optical communication with the first optoelectronic device and configured to output the optical signals generated by the first optoelectronic device; and
   electrical circuitry configured to provide first electrical signals to the first optoelectronic device and second electrical signals to the second optoelectronic device wherein the electrical circuitry is configured to controllably adjust at least the second electrical signals to controllably adjust a temperature of at least one section of the first optoelectronic device by controlling heat compensation produced by the second optoelectronic device.

2. The apparatus of claim 1, wherein the first electrical signals are configured to control the generation of optical signals by the first optoelectronic device.

3. The apparatus of claim 1, wherein the first and second optoelectronic devices have the same design.

4. The apparatus of claim 1, wherein the first and second optoelectronic devices have different designs.

5. The apparatus of claim 1, wherein the first and second optoelectronic devices are formed on the same substrate.

6. The apparatus of claim 1, wherein the first optoelectronic device comprises a tunable laser.

7. The apparatus of claim 1, wherein the first electrical signals and the second electrical signals are configured to control the summed heat generated and dissipated by both the first optoelectronic device and the second optoelectronic device over time to maintain a temperature of the at least one section of the first optoelectronic device within a predetermined range.

8. The apparatus of claim 1, wherein the first electrical signals and the second electrical signals are configured such that when an electrical current provided to the at least one section of the first optoelectronic device is driven downwards from a nominal value, another electrical current provided to the second optoelectronic device is driven by a similar amount upwards.

9. The apparatus of claim 1, wherein the first electrical signals comprise a time varying signal.

10. The apparatus of claim 9, wherein the time varying signal comprises a modulated current or voltage having a modulation frequency larger than 1 Hz.

11. The apparatus of claim 9, wherein the time varying signal comprises a modulated current or voltage having a modulation frequency larger than 1 KHz.

12. An apparatus comprising:
    a first optoelectronic device configured to generate optical signals;
    a second optoelectronic device in thermal communication with the first optoelectronic device;
    an optical output port in optical communication with the first optoelectronic device and configured to output the optical signals generated by the first optoelectronic device; and
    electrical circuitry configured to provide first electrical signals to the first optoelectronic device and second electrical signals to the second optoelectronic device, wherein the second electrical signals are configured to operate the second optoelectronic device to generate a thermal load that is summed with a thermal load from the first optoelectronic device such that a temperature of the first optoelectronic device is controlled during operation of the first optoelectronic device.

13. The apparatus of claim 12, wherein the temperature of the first optoelectronic device stays constant.

14. A method of manufacturing an apparatus, the method comprising:
providing a substrate comprising at least first and second optoelectronic devices that are in thermal communication with one another; and
electrically connecting the first and second optoelectronic devices to an electrical circuitry configured to provide first electrical signals to the first optoelectronic device and to provide second electrical signals to the second optoelectronic device, wherein the electrical circuitry is configured to controllably adjust at least the second electrical signals to controllably adjust a temperature of at least one section of the first optoelectronic device by controlling heat compensation produced by the second optoelectronic.

15. The method of claim 14, wherein the first optoelectronic device is configured to generate optical signals and the first electrical signals are configured to control the generation of optical signals by the first optoelectronic device.

16. The method of claim 14, wherein electrically connecting the first and second optoelectronic devices to the electrical circuitry comprises electrically connecting the first and second optoelectronic devices to the electrical circuitry based on a first optical performance of the first optoelectronic device and a second optical performance of the second optoelectronic device.

17. The method of claim 16, wherein the first optical performance of the first optoelectronic device is different from the second optical performance of the second optoelectronic device by a threshold amount.

18. The method of claim 14, wherein electrically connecting the first and second optoelectronic devices to the electrical circuitry comprises electrically connecting the first optoelectronic device to the electrical circuitry based at least in part on a design of the first optoelectronic device.

19. The method of claim 14, wherein electrically connecting the first and second optoelectronic devices to the electrical circuitry comprises electrically connecting the first optoelectronic device to the electrical circuitry based at least in part on an application of the first optoelectronic device.

20. An apparatus comprising:
a first optoelectronic device configured to generate optical signals;
a second optoelectronic device in thermal communication with the first optoelectronic device;
an optical output port in optical communication with the first optoelectronic device and configured to output the optical signals generated by the first optoelectronic device; and
electrical circuitry configured to provide first electrical signals to the first optoelectronic device and second electrical signals to the second optoelectronic device, wherein said electrical circuitry is configured to adjust at least the second electrical signals based at least in part on a measure of one or more temperatures of the first optoelectronic device.

21. An apparatus comprising:
a first optoelectronic device configured to generate optical signals;
a second optoelectronic device in thermal communication with the first optoelectronic device;
an optical output port in optical communication with the first optoelectronic device and configured to output the optical signals generated by the first optoelectronic device; and
electrical circuitry configured to provide first electrical signals to the first optoelectronic device and second electrical signals to the second optoelectronic device, wherein said electrical circuitry is configured to adjust at least the second electrical signals based at least in part on a measured optical power of light output by said first optoelectronic device.

22. An apparatus comprising:
a first optoelectronic device configured to generate optical signals;
a second optoelectronic device in thermal communication with the first optoelectronic device;
an optical output port in optical communication with the first optoelectronic device and configured to output the optical signals generated by the first optoelectronic device; and
electrical circuitry configured to provide first electrical signals to the first optoelectronic device and second electrical signals to the second optoelectronic device, wherein said electrical circuitry is configured to adjust at least the second electrical signals based at least in part on a measure of wavelength of light output by said first optoelectronic device.

* * * * *